(12) United States Patent
Kim et al.

(10) Patent No.: US 11,706,885 B2
(45) Date of Patent: Jul. 18, 2023

(54) DISPLAY DEVICE

(71) Applicant: Samsung Display Co., LTD., Yongin-si (KR)

(72) Inventors: Tae Sung Kim, Bucheon-si (KR); Young Ji Kim, Jeju-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 119 days.

(21) Appl. No.: 17/314,624

(22) Filed: May 7, 2021

(65) Prior Publication Data
US 2022/0015249 A1 Jan. 13, 2022

(30) Foreign Application Priority Data

Jul. 13, 2020 (KR) .......................... 10-2020-0085882

(51) Int. Cl.
*H05K 5/02* (2006.01)
*H05K 5/00* (2006.01)
*H02K 7/116* (2006.01)
*F16H 21/44* (2006.01)

(52) U.S. Cl.
CPC ........... *H05K 5/0217* (2013.01); *H02K 7/116* (2013.01); *H05K 5/0017* (2013.01); *F16H 21/44* (2013.01)

(58) Field of Classification Search
USPC ................. 361/807, 728, 755, 809, 810
See application file for complete search history.

(56) References Cited

U.S. PATENT DOCUMENTS

| 10,534,402 B1* | 1/2020 | Kim .................... G09F 15/0062 |
| 2006/0209406 A1* | 9/2006 | Choi .................... G03B 21/58 |
| | | 359/461 |
| 2012/0074075 A1 | 3/2012 | Garcia et al. |
| 2018/0114471 A1* | 4/2018 | Park ..................... G06F 1/1652 |
| 2019/0036067 A1 | 1/2019 | Kim et al. |
| 2019/0036068 A1 | 1/2019 | Kim et al. |
| 2019/0037716 A1 | 1/2019 | Kim et al. |

FOREIGN PATENT DOCUMENTS

| KR | 10-1178383 | 8/2012 |
| KR | 10-2014-0105886 | 9/2014 |
| KR | 10-2016-0011718 | 2/2016 |
| KR | 10-2016-0013289 | 2/2016 |
| KR | 10-2016-0081786 | 7/2016 |
| KR | 10-2017-0012628 | 2/2017 |
| KR | 10-2018-0045980 | 5/2018 |
| KR | 10-2031910 | 10/2019 |

* cited by examiner

*Primary Examiner* — Hung S. Bui
(74) *Attorney, Agent, or Firm* — Kile Park Reed & Houtteman PLLC

(57) ABSTRACT

A display device includes a display panel, a first lift member connected to a side of the display panel and including a first elevation member rotating in a first rotation direction, a second lift member connected to another side of the display panel and including a second elevation member rotating in a second rotation direction different from the first rotation direction, a drive member connected to the first lift member and the second lift member, the drive member rotating the first elevation member and the second elevation member, a first link member having a side connected to the first elevation member, a second link member having a side connected to the second elevation member, a first sync gear connected to another side of the first link member, and a second sync gear engaged with the first sync gear and connected to another side of the second link member.

22 Claims, 12 Drawing Sheets

DISPLAY DEVICE

CROSS-REFERENCE TO RELATED APPLICATION(S)

This application claims priority to and benefits of Korean Patent Application No. 10-2020-0085882 under 35 U.S.C. § 119, filed on Jul. 13, 2020 in the Korean Intellectual Property Office, the entire contents of which are incorporated herein by reference.

BACKGROUND

1. Technical Field

The disclosure relates to a display device.

2. Description of the Related Art

A flexible display panel may be made of a flexible material, such as a plastic material that is bendable like paper, instead of a conventional rigid glass substrate.

A display device employing such a flexible display panel may be classified into a bendable display device that can be bent without breaking and a foldable display device that can be folded, and the like.

Recently, research is being conducted on a rollable display device of which a flexible display panel is wound and unwound on a roller as necessary.

SUMMARY

Aspects of the invention are to provide a display device capable of adjusting lifting speeds of one part and another part of the display panel uniformly or differently.

However, aspects of the invention are not restricted to the one set forth herein. The above and other aspects of the invention will become more apparent to one of ordinary skill in the art to which the invention pertains by referencing the detailed description of the invention given below.

In an embodiment, a display device may include a display panel, a first lift member connected to a side of the display panel and including a first elevation member rotating in a first rotation direction, a second lift member connected to the other side of the display panel and including a second elevation member rotating in a second rotation direction different from the first rotation direction, a drive member connected to the first lift member and the second lift member, the drive member rotating the first elevation member and the second elevation member, a first link member having a side connected to the first elevation member, a second link member having a side connected to the second elevation member, a first sync gear connected to another side of the first link member, the first sync gear rotating in association with rotation of the first elevation member, and a second sync gear engaged with the first sync gear and connected to the other side of the second link member, and the second sync gear rotating in association with rotation of the second elevation member.

In an embodiment, the drive member may include a linear motor that expands or contracts in a width direction of the display panel.

In an embodiment, a side of the drive member may be rotatably connected to the first elevation member, and another side of the drive member may be rotatably connected to the second elevation member.

In an embodiment, the side of the drive member may be connected to a middle portion of the first elevation member, and the another side of the drive member may be connected to a middle portion of the second elevation member.

In an embodiment, the drive member may expand to increase a distance between the first elevation member and the second elevation member when the display panel is lifted up, and the drive member may shorten to decrease a distance between the first elevation member and the second elevation member when the display panel is lifted down.

In an embodiment, the drive member may move up as the display panel is lifted up, and the drive member may move down as the display panel is lifted down.

In an embodiment, the display device may further include a third elevation member connected to an upper portion of the display panel, a fourth elevation member spaced apart from the third elevation member and connected to another upper portion of the display panel, a first connection member connecting a side of the first elevation member to a side of the third elevation member, and a second connection member connecting a side of the second elevation member to a side of the fourth elevation member.

In an embodiment, the display device may further include a panel support member covering at least a part of a surface of the display panel and including segments. Another side of the third elevation member and another side of the fourth elevation member may be rotatably coupled to the panel support member.

In an embodiment, the first lift member may vary in height by rotation of the first elevation member, the second lift member may vary in height by rotation of the second elevation member, and a ratio of a height change of the second lift member to a height change of the first lift member may be determined by a gear ratio of the first sync gear and the second sync gear.

In an embodiment, the gear ratio of the first sync gear and the second sync gear may be 1:1, and in case that the display panel is lifted up or down, a lifting speed of the side of the display panel may be equal to a lifting speed of the another side of the display panel.

In an embodiment, a number of teeth of the first sync gear may be different from a number of teeth of the second sync gear, and a lifting speed of the side of the display panel may be different from a lifting speed of the another side of the display panel.

In an embodiment, the first elevation member may include a first rod member and a first link connection member protruding toward the first sync gear, and the second elevation member may include a second rod member and a second link connection member protruding toward the second sync gear.

In an embodiment, a protruding length of the first link connection member may be equal to or less than a radius of the first sync gear, and a protruding length of the second link connection member may be equal to or less than a radius of the second sync gear.

In an embodiment, the display device may further include a first support member that support the first elevation member, a second support member that supports the second elevation member, a first coupling member that rotatably couples the first link connection member to the first link member, and a second coupling member that rotatably couples the second link connection member to the second link member.

In an embodiment, the first support member may include a first guide groove that guides a movement path of the first coupling member, and the second support member may include a second guide groove that guides a movement path of the second coupling member.

In an embodiment, the first link member and the second link member may move up as the display panel is lifted up, and the first link member and the second link member may move down as the display panel is lifted down.

In an embodiment, the display panel may further include a first stopper protruding in a direction crossing a length direction of the first link member and limiting a maximum descending distance of the first link member, and a second stopper protruding in a direction crossing a length direction of the second link member and limiting a maximum descending distance of the second link member.

In an embodiment, the display panel may further include a first stop surface disposed below the first stopper, and a second stop surface disposed below the second stopper. In case that the display panel is maximally lifted down, the first stopper may contact the first stop surface and the second stopper may contact the second stop surface.

In an embodiment, the first sync gear and the second sync gear may each include a position mark that identifies whether the display panel is maximally lifted up.

In an embodiment, the first sync gear and the second sync gear may each be a helical gear.

The display device according to an embodiment is capable of adjusting lifting speeds of one part and another part of the display panel uniformly or differently.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
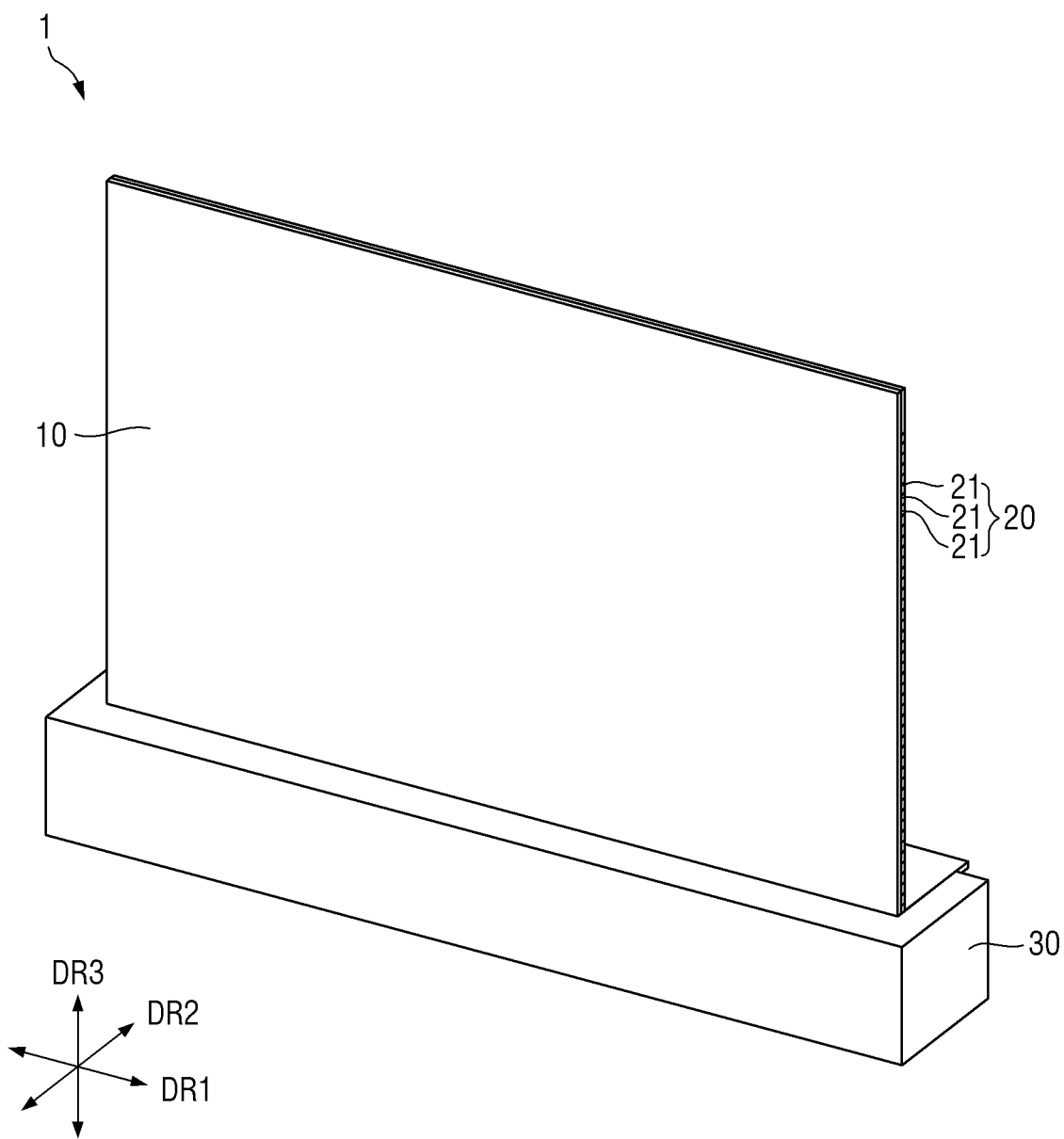
FIG. 1 is a perspective view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

The same reference numbers indicate the same components throughout the specification. In the attached figures, the thickness of layers and regions may be exaggerated for clarity and convenience of explanation. Therefore, as the sizes and thicknesses of components in the drawings may be arbitrarily illustrated for convenience of explanation, the following embodiments of the disclosure are not limited thereto.

As used herein, the expressions used in the singular such as "a," "an," and "the" are intended to include the plural forms as well, unless the context clearly indicates otherwise.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

In the description, it will be understood that when an element (a region, a layer, a section, or the like) is referred to as being "on", "connected to" or "coupled to" another element, it can be directly on, connected, or coupled to the other element, or one or more intervening elements may be disposed therebetween.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

The terms "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described in detail with reference to the accompanying drawings.

Figure 2:
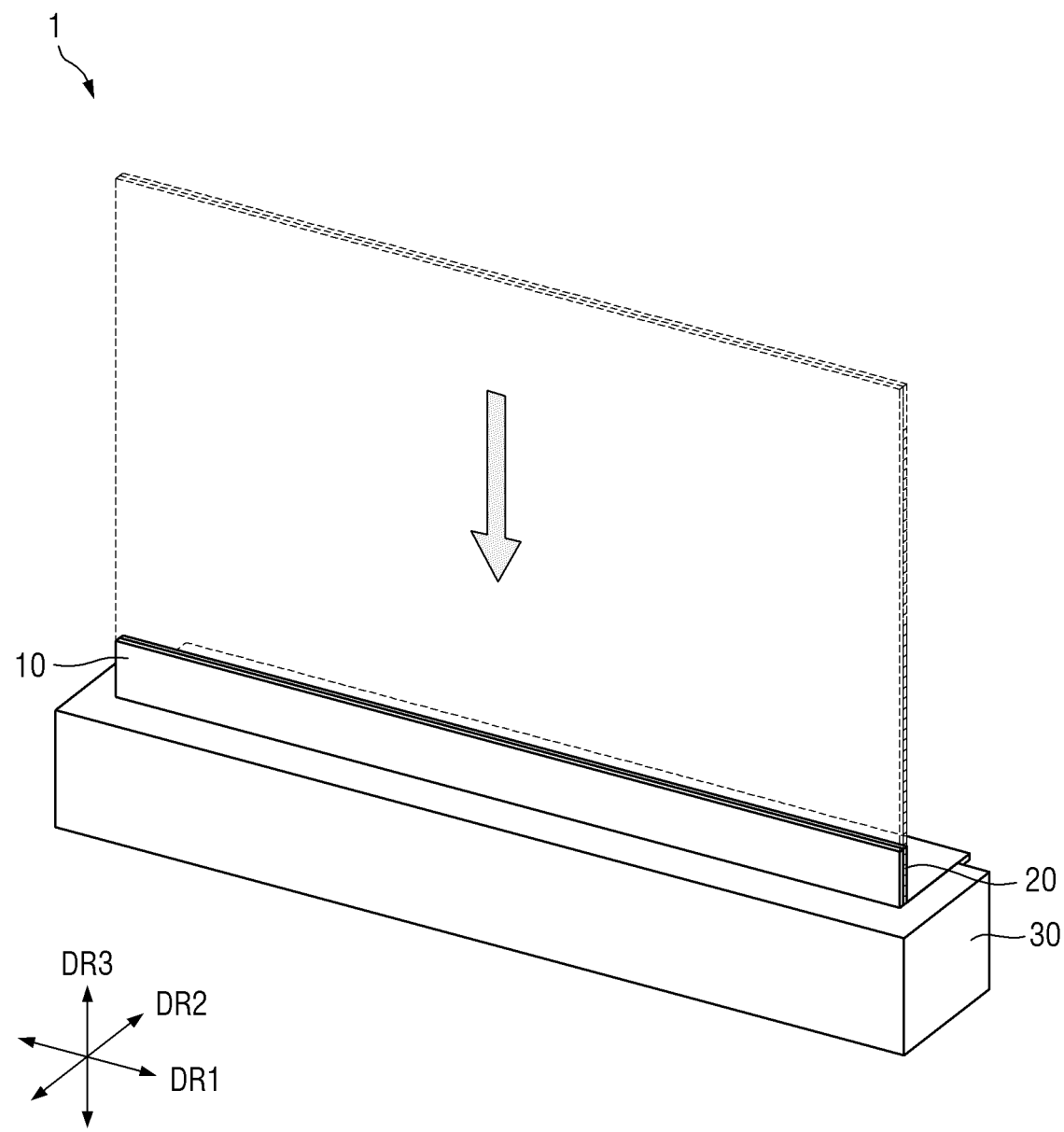
FIG. 2 is a perspective view illustrating a display panel being drawn into a housing of a display device according to an embodiment.
Figure 3:
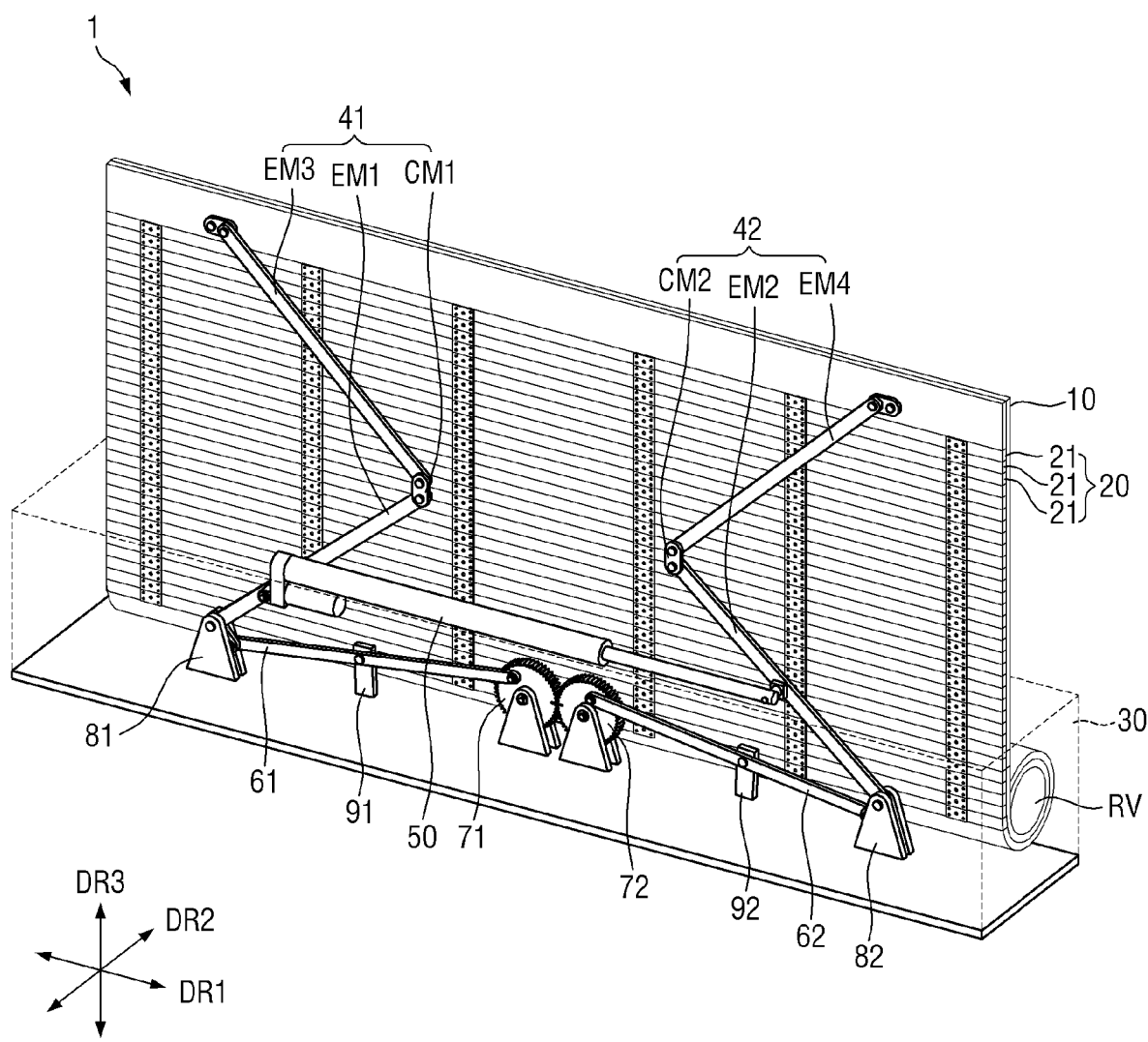
FIG. 3 is a perspective view illustrating a rear surface of a display device according to an embodiment.
Figure 4:
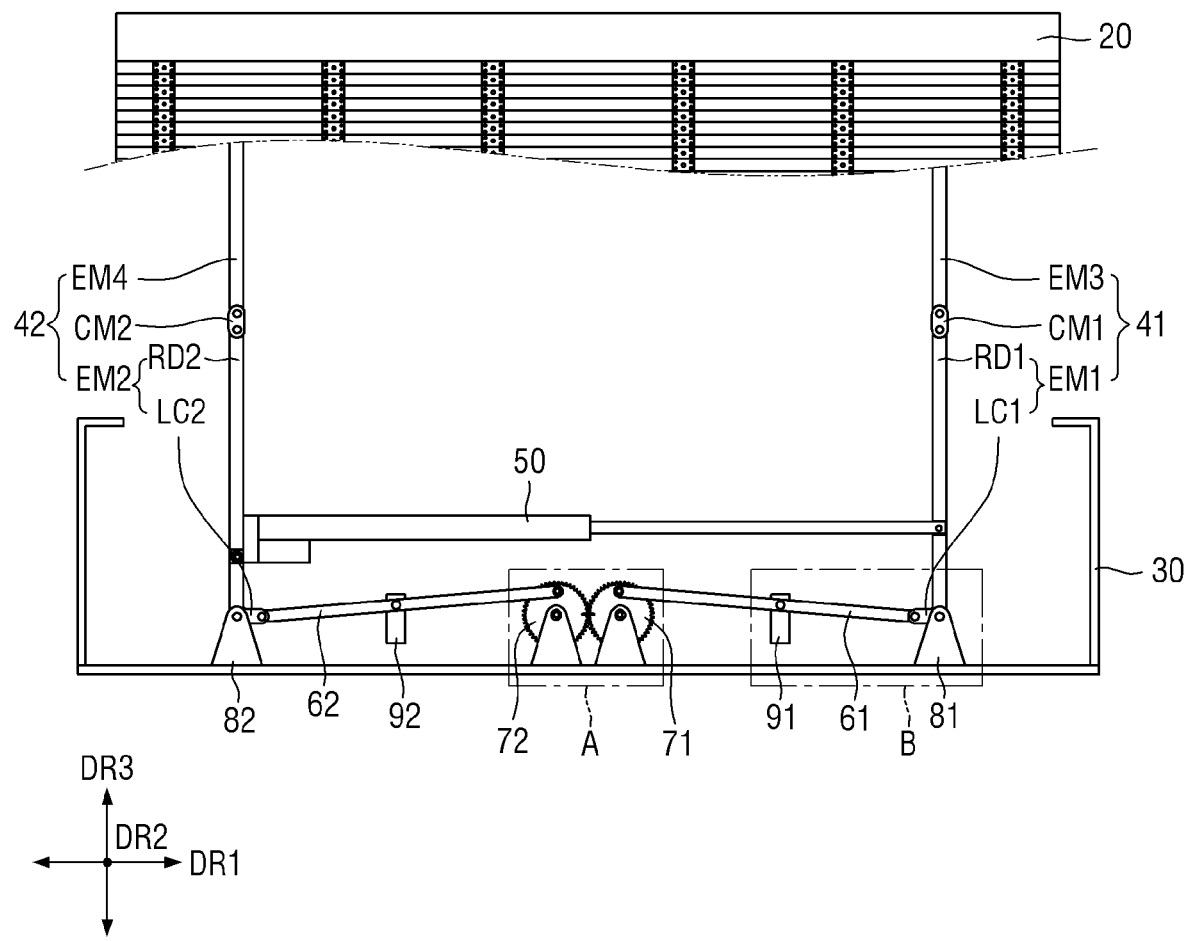
FIG. 4 is a front view of a display device of which the display panel was drawn out according to an embodiment.

FIG. 1 is a perspective view of a display device according to an embodiment. FIG. 2 is a perspective view illustrating a display panel being drawn into a housing of a display device according to an embodiment. FIG. 3 is a perspective view illustrating a rear surface of a display device according to an embodiment. FIG. 4 is a front view of a display device of which the display panel was drawn out according to an embodiment.

Hereinafter, a first direction DR1, a second direction DR2, and a third direction DR3 cross each other in different directions. The first direction DR1 may be a horizontal direction. The second direction DR2 may be a vertical direction. The third direction DR3 may be a thickness direction. The first direction DR1, the second direction DR2 and/or the third direction DR3 may include two or more directions. For example, the third direction DR3 may include an upward direction toward the upper side of the drawing and a downward direction toward the lower side of the drawing. Accordingly, one surface of a member that faces upward may be referred to as top surface, and the other surface of the member that faces downward may be referred to as bottom surface. However, the directions refer to relative directions and are not limited to the aforementioned examples.

In the following description, a display device 1 may be a rollable display device having a flexible display panel 10 of which at least a part is wound and/or unwound by a roller RV but the disclosure is not limited thereto.

Referring to FIGS. 1 to 3, the display device 1 includes a display panel 10, a first lift member 41, a second lift member 42, a drive member 50, a first link member 61, a second link member 62, a first sync gear 71, and a second sync gear 72. The display panel 10 may further include a roller RV, a panel support member 20, a housing 30, a first support member 81, a second support member 82, a first stopper 91, and a second stopper 92.

The display panel 10 displays a screen or an image. Examples of the display panel 10 may include not only a self-light emitting display panel such as an organic light emitting display (OLED) panel, an inorganic electroluminescence (EL) display panel, a quantum dot light emitting display (QED) panel, a micro-LED display panel, a nano-LED display panel, a plasma display panel (PDP), a field emission display (FED) panel and a cathode ray tube (CRT) display panel, but also a light receiving display panel such as a liquid crystal display (LCD) panel and an electrophoretic display (EPD) panel.

The display panel 10 may have flexibility so as to be bendable. In embodiments, the display panel 10 may be mounted, in the state of being at least partly wound on the roller RV, inside the housing 30. The display panel 10 may be wound or unwound on the roller RV so as to be drawn in or out through an opening on the top of the housing 30 as the display panel 10 is lifted up or down.

The panel support member 20 supports the display panel 10. In an embodiment, the panel support member 20 may be a plate-shaped member covering at least a part of a surface of the display panel 10, but the disclosure is not limited thereto. The panel support member 20 may include segments 21 rotatably connected to each other. Accordingly, the panel support member 20 may be attached to a surface of the display panel 10 to be wound and unwound on the roller RV along with the display panel 10. In embodiments, the panel support member 20 may be a cover member, e.g., a bracket and/or a frame, coupled to the top end of the display panel 10 to lift up or down one end of the display panel 10.

The roller RV may be formed of a cylindrical member for winding and unwinding the display panel 10 as the display panel 10 is lifted up or down.

The housing 30 may have an opening on the top thereof through which the display panel 10 is drawn in and out, and provides an inner space in which the display panel 10 accommodated. In an embodiment, the housing 30 may have a rectangular parallelepiped shape having an opening on the top thereof, without being limited thereto.

The first lift member 41 is connected to a side of the display panel 10. A side of the display panel 10 may be a side of an upper portion of the display panel 10, e.g., an upper right corner portion of the display panel 10. The first lift member 41 may vary in length in the third direction DR3 to lift up or down a side of the display panel 10. The length in the third direction DR3 may be a height. The third direction DR3 may be a length direction of the display panel 10.

The second lift member 42 is disposed to be spaced apart from the first lift member 41 and is connected to another side of the display panel 10. The another side of the display panel 10 may be the other side of the upper portion of the display panel 10, e.g., an upper left corner portion of the display panel 10. The second lift member 42 may vary in length in the third direction DR3 to lift up or down the other side of the display panel 10. The length in the third direction DR3 may be a height. The third direction DR may be a length direction of the display panel 10.

The first lift member 41 and the second lift member 42 may each include elevation members and at least one connection member that rotatably connects the elevation members, which are folded and unfolded to change the length in the third direction DR3. In an embodiment, the first lift member 41 and the second lift member 42 may each include two elevation members and one connection member connecting them.

The connection members of the first lift member 41 and the second lift member 42 are referred to as a first connection member CM1 and a second connection member CM2, respectively, for convenience of explanation. The elevation member positioned below the first connection member CM1 is referred to as a first elevation member EM1, the elevation member positioned below the second connection member CM2 is referred to as a second elevation member EM2, the elevation member positioned above the first connection member CM1 is referred to as a third elevation member EM3, and the elevation member positioned above the second connection member CM2 is referred to as a fourth elevation member EM4. However, the above references are for illustrative purposes only, and the embodiments are not limited thereto.

In an embodiment, the first elevation member EM1, the second elevation member EM2, the third elevation member EM3, and the fourth elevation member EM4 may each be made in the form of a long bar-shaped metal frame. In embodiments, the first elevation member EM1, the second elevation member EM2, the third elevation member EM3, and the fourth elevation member EM4 may each be implemented in the form of a link, a cylinder, or an arm.

A side of the first elevation member EM1 may be rotatably connected to the first connection member CM1, and another side thereof may be rotatably connected to the first support member 81 to be described later. In an embodiment, the another side of the first elevation member EM1 may be bent in an L shape toward the first sync gear 71.

The first elevation member EM1 may include a first rod member RD1 and a first link connection member LC1.

The first rod member RD1 may extend straight between the first connection member CM1 and the first support member 81. One end of the first rod member RD1 may be rotatably connected to the first connection member CM1, and the another end thereof is rotatably connected to the first support member 81.

The first link connection member LC1 may be connected to the another end of the first rod member RD1 and may extend to protrude in a direction crossing the length direction of the first rod member RD1. The first link connection member LC1 may protrude from the another end of the first rod member RD1 toward the first sync gear 71 such that the first elevation member EM1 has an L shape, and may be rotatably coupled, at the another end of the first rod member RD1 and/or at a portion where the first rod member RD1 and the first link connection member LC1 cross each other, to the first support member 81. The first link connection member LC1 may be shorter in length than the first elevation member EM1. The length of the first link connection member LC1 may be equal to or less than the radius of the first sync gear 71. In an embodiment, the first link connection member LC1 may extend to cross the length direction of the first rod member RD1 at about 90 degrees, without being limited thereto.

The second elevation member EM2 may include a first rod member RD2 and a second link connection member LC2.

The second rod member RD2 may extend straight between the second connection member CM2 and the second support member 82. One end of the second rod member RD2 may be rotatably connected to the second connection member CM2, and another end thereof may be rotatably connected to the second support member 82.

The second link connection member LC2 may be connected to the another end of the second rod member RD2 and may extend to protrude in a direction crossing the length direction of the second rod member RD2. The second link connection member LC2 may protrude from the another end of the second rod member RD2 toward the second sync gear 72 such that the second elevation member EM2 has an L shape, and may be rotatably coupled, at the another end of the second rod member RD2 and/or at a portion where the second rod member RD2 and the second link connection member LC2 cross each other, to the second support member 82. The second link connection member LC2 may be shorter in length than the second elevation member EM2. The length of the second link connection member LC2 may be equal to or less than the radius of the second sync gear 72. In an embodiment, the second link connection member LC2 may extend to cross the length direction of the second rod member RD2 at about 90 degrees, without being limited thereto.

A side of the third elevation member EM3 may be rotatably connected to the first connection member CM1, and another side of the third elevation member EM3 may be connected to the side of the display panel 10. As described above, the side of the display panel 10 may be the upper right corner portion of the display panel 10. The another side of the third elevation member EM3 may be rotatably coupled to the panel support member 20 covering the side of the display panel 10.

A side of the fourth elevation member EM4 may be rotatably connected to the second connection member CM2, and another side of the fourth elevation member EM4 may be connected to the another side of the display panel 10. As described above, the another side of the display panel 10 may be the upper left corner portion of the display panel 10. The another side of the fourth elevation member EM4 may be rotatably coupled to the panel support member 20 covering the another side of the display panel 10.

The first connection member CM1 may connect a side of the first elevation member EM1 to a side of the third elevation member EM3. The side of the first elevation member EM1 and the side of the third elevation member EM3 may each be rotatably connected to the first connection member CM1, and the first elevation member EM1 and the third elevation member EM3 may rotate in different directions about the first connection member CM1 when the display panel 10 is lifted up or down. Accordingly, the first and third elevation members EM1 and EM3 may form an angle, which may vary.

For example, when the display panel 10 is lifted down, the first elevation member EM1 may rotate in the counterclockwise direction about the first connection member CM1, and the third elevation member EM3 may rotate in the clockwise direction about the first connection member CM1. The angle formed between the first and third elevation members EM1 and EM3 may decrease, and the another side of the first elevation member EM1 and the another side of the third elevation member EM3 may be drawn near to each other. When the display panel 10 is lifted up, the first elevation member EM1 may rotate in the clockwise direction about the first connection member CM1, and the third elevation member EM3 may rotate in the counterclockwise direction about the first connection member CM1. The angle formed between the first and third elevation members EM1 and EM3 may increase, and the another side of the first elevation member EM1 and the another side of the third elevation member EM3 may be separated away from each other.

In embodiments, the side of the first elevation member EM1 and the side of the third elevation member EM3 may each include a gear, and the first connection member CM1 may cover the side of the first elevation member EM1 and the side of the third elevation member EM3 at which the gear is disposed.

The second connection member CM2 may connect a side of the second elevation member EM2 to a side of the fourth elevation member EM4. The side of the second elevation member EM2 and the side of the fourth elevation member EM4 may each be rotatably connected to the second connection member CM2, and the second elevation member EM2 and the fourth elevation member EM4 may rotate in different directions about the second connection member CM2 when the display panel 10 is lifted up or down. Accordingly, the second and fourth elevation members EM2 and EM4 may form an angle, which may vary.

For example, when the display panel 10 is lifted down, the second elevation member EM2 may rotate in the clockwise direction about the second connection member CM2, and the fourth elevation member EM4 may rotate in the counterclockwise direction about the second connection member CM2. The angle formed between the second and fourth elevation members EM2 and EM4 may decrease, and the another side of the second elevation member EM2 and the another side of the fourth elevation member EM4 may be drawn near to each other. When the display panel 10 is lifted up, the second elevation member EM2 may rotate in the counterclockwise direction about the second connection member CM2, and the fourth elevation member EM4 may rotate in the clockwise direction about the second connection member CM2. The angle formed between the second and fourth elevation members EM2 and EM4 may increase, and the another side of the second elevation member EM2 and the another side of the fourth elevation member EM4 may be separated away from each other.

In embodiments, the side of the second elevation member EM2 and the side of the fourth elevation member EM4 may each include a gear, and the second connection member CM2 may cover the side of the second elevation member EM2 and the side of the fourth elevation member EM4 at which the gear is disposed.

As the display panel 10 is lifted up or down, the distance between the first and second connection members CM1 and CM2 may vary in the first direction DR1. The first direction DR1 may be a width direction of the display panel 10. For example, the distance between the first and second connection members CM1 and CM2 may decrease in the case where the display panel 10 is lifted down and increase in the case where the display panel 10 is lifted up.

The drive member 50 may drive the first and second lift members 41 and 42 to move up or move down the display panel 10. The drive member 50 may be connected to the first and second lift members 41 and 42.

The drive member 50 may include a linear motor that expands or contracts to change its length.

A side of the drive member 50 may be rotatably connected to the first elevation member EM1, and another side thereof may be rotatably connected to the second elevation member EM2. The side and the another side of the drive member 50 may be connected to middle portions of the first and second elevation members EM1 and EM2, respectively. The middle portion of the first elevation member EM1 may be a portion spaced apart from one end connected to the first connection member CM1 and the another end connected to the first support member 81. The middle portion of the second elevation member EM2 may be a portion spaced apart from one end connected to the second connection member CM2 and the another end connected to the second support member 82. In an embodiment, a distance from the side of the drive member 50 to the first connection member CM1 may be greater than a distance from the side of the drive member 50 to the first support member 81, and a distance from the another side of the drive member 50 to the second connection member CM2 may be greater than a distance from the another side of the drive member 50 to the second support member 82. In some embodiments, a side of the drive member 50 may be connected to the third elevation member EM3, and another side of the drive member 50 may be connected to the fourth elevation member EM4.

The linear motor may expand or contract such that its length varies in the first direction DR1. The first direction DR1 may be a width direction of the display panel 10. In an embodiment, the length of the linear motor may increase when the display panel 10 is lifted up, and the length of the linear motor may decrease when the display panel 10 is lifted down. In embodiments, the length of the linear motor may decrease when the display panel 10 is lifted up, and the length of the linear motor may increase when the display panel 10 is lifted down.

The drive member 50 may vary in position when the display panel 10 is lifted up or down. The drive member 50 may vary in height. The height may be a distance between a support surface supporting the first and second lift members 41 and 42, e.g., bottom surface of the inner space of the housing 30, and the drive member 50 in the third direction DR3. In an embodiment, the drive member 50 may move up or down as the display panel 10 is lifted up or down. For example, the drive member 50 may move up in the case where the display panel 10 is lifted up and may move down in the case where the display panel 10 is lifted down.

The first link member 61 may be interlocked with the first lift member 41 and the first sync gear 71. In an embodiment, the first link member 61 may be formed of a long bar-shaped metal frame. A side of the first link member 61 may be rotatably connected to the first elevation member EM1, and another side of the first link member 61 may be rotatably connected to the first sync gear 71. In an embodiment, the side of the first link member 61 may be connected to the first link connection member LC1 of the first elevation member EM1. In embodiments, the side of the first link member 61 may be connected to a middle portion of the first rod member RD1 of the first elevation member EM1, and the first link connection member LC1 may be omitted.

The second link member 62 may be interlocked with the second lift member 42 and the second sync gear 72. In an embodiment, the second link member 62 may be formed of a long bar-shaped metal frame. A side of the second link member 62 may be rotatably connected to the second elevation member EM2, and another side of the second link member 62 may be rotatably connected to the second sync gear 72. In an embodiment, the side of the second link member 62 may be connected to the second link connection member LC2 of the second elevation member EM2. In embodiments, the side of the second link member 62 may be connected to a middle portion of the second rod member RD2 of the second elevation member EM2, and the second link connection member LC2 may be omitted.

The distance between the first and second link members 61 and 62 may vary when the display panel 10 is lifted up or down. In an embodiment, the distance between the first and second link members 61 and 62 may increase in the case where the display panel 10 is lifted down and decrease in the case where the display panel 10 is lifted up. In embodiments, the distance between the first and second link members 61 and 62 may decrease in the case where the display panel 10 is lifted down and increase in the case where the display panel 10 is lifted up.

When the display panel 10 is lifted up or down, the heights of the first and second link members 61 and 62 may vary. The heights may be heights from the bottom surface defining the inner space of the housing 30 to be described later. In an embodiment, the heights of the first and second link members 61 and 62 may decrease in the case where the display panel 10 is lifted down and increase in the case where the display panel 10 is lifted up. In embodiments, the heights of the first and second link members 61 and 62 may increase in the case where the display panel 10 is lifted down and decrease in the case where the display panel 10 is lifted up.

The first and second lift members 41 and 42 may be interlocked by sync gears disposed between the first and second lift members 41 and 42. In an embodiment, the sync gears may be implemented as two sync gears. Although the sync gears interworking with the first and second lift members 41 and 42 are respectively referred to as first and second sync gears 71 and 72 for convenience of explanation, the disclosure is not limited thereto.

The first sync gear 71 is connected to the first lift member 41 by the first link member 61. In an embodiment, the first link member 61 may be arranged to rotate about a first axis in the second direction DR2, and the another side of the first link member 61 may be connected to an upper part of the first sync gear 71 with respect to the first axis in the second direction DR2. In embodiments, the first link member 61 may be connected to a lower part of the first sync gear 71.

The second sync gear 72 may be connected to the second lift member 42 by the second link member 62. In an embodiment, the second link member 62 may be arranged to rotate about a second axis in the second direction DR2, and the another side of the second link member 62 may be connected to an upper part of the second sync gear 72 with respect to the second axis in the second direction DR2. In embodiments, the second link member 62 may be connected to a lower part of the second sync gear 72. The second sync gear 72 may be disposed to be directly engaged with the first sync gear 71. Accordingly, the torque of the first elevation member EM1 may be transmitted to the second elevation member EM2 such that the rotation angles of the first and second lift members 41 and 42 may be adjusted in an interlocked manner.

The first and second sync gears 71 and 72 may rotate in association with a change in length of the first and second lift members 41 and 42. In an embodiment, the first sync gear 71 may rotate in association with the rotation of the first elevation member EM1, and the second sync gear 72 may rotate in association with the rotation of the second elevation member EM2. In case that the display panel 10 is lifted up or down, the first and second sync gears 71 and 72 may rotate in different directions from the rotation directions of the first and second elevation members EM1 and EM2, respectively. For example, when the display panel 10 is lifted down, the first elevation member EM1 and the second sync gear 72 may rotate in the counterclockwise direction, and the second elevation member EM2 and the first sync gear 71 may rotate in the clockwise direction. When the display panel 10 is lifted up, the first elevation member EM1 and the second sync gear 72 may rotate in the clockwise direction, and the second elevation member EM2 and the first sync gear 71 may rotate in the counterclockwise direction. In embodiments, when the display panel 10 is lifted up or down, the first and second sync gears 71 and 72 may rotate in the same directions as the rotation directions of the first and second elevation members EM1 and EM2, respectively.

The first support member 81 is rotatably connected to the lower end of the first lift member 41 to support the lower end of the first lift member 41. The first support member 81 may be rotatably connected to the another side of the first elevation member EM1. The first support member 81 may be rotatably coupled to a portion where the first rod member RD1 and the first link connection member LC1 cross each other.

The second support member 82 is rotatably connected to the lower end of the second lift member 42 to support the lower end of the second lift member 42. The second support member 82 may be rotatably connected to the another side of the second elevation member EM2. The second support member 82 may be rotatably connected to a portion where the second rod member RD2 and the second link connection member LC2 cross each other.

In an embodiment, the first and second support members 81 and 82 may be fixed to the bottom surface of the inner space of the housing 30 and formed of a column-shaped member whose width decreases as it goes upward, without being limited thereto.

The first stopper 91 may be connected to the first link member 61 and may protrude in a direction crossing the length direction of the first link member 61. The first stopper 91 may move up or down along with the first link member 61. The first stopper 91 may limit a maximum descending distance of the first link member 61 and a maximum descending distance of the side of the display panel 10. In an embodiment, at least a part of the first stopper 91 may protrude downward such that the bottom end of the first stopper 91 contacts, when the display panel 10 is fully lifted down, the bottom surface of the inner space of the housing 30. In embodiments, at least a part of the first stopper 91 may protrude upward such that the top end of the first stopper 91 contacts, when the display panel 10 is fully lifted down, the drive member 50 and/or the third elevation member EM3.

The second stopper 92 may be connected to the second link member 62 and may protrude in a direction crossing the length direction of the second link member 62. The second stopper 92 may move up or down along with the second link member 62. The second stopper 92 may limit a maximum descending distance of the second link member 62 and a maximum descending distance of the another side of the display panel 10. In an embodiment, at least a part of the second stopper 92 may protrude downward such that the bottom end of the second stopper 92 contacts, when the display panel 10 is fully lifted down, the bottom surface of the inner space of the housing 30. In embodiments, at least a part of the second stopper 92 may protrude upward such that the top end of the second stopper 92 contacts, when the display panel 10 is fully lifted down, the drive member 50 and/or the fourth elevation member EM4.

In an embodiment, the first lift member 41, the first link member 61, and the first sync gear 71 may respectively be symmetrical in structure with the second lift member 42, the second link member 62, and the second sync gear 72, but the disclosure is not limited thereto.

Hereinafter, a description is made of the detailed operation of the display device 1 with reference to FIGS. 4 to 9.

Figure 5:
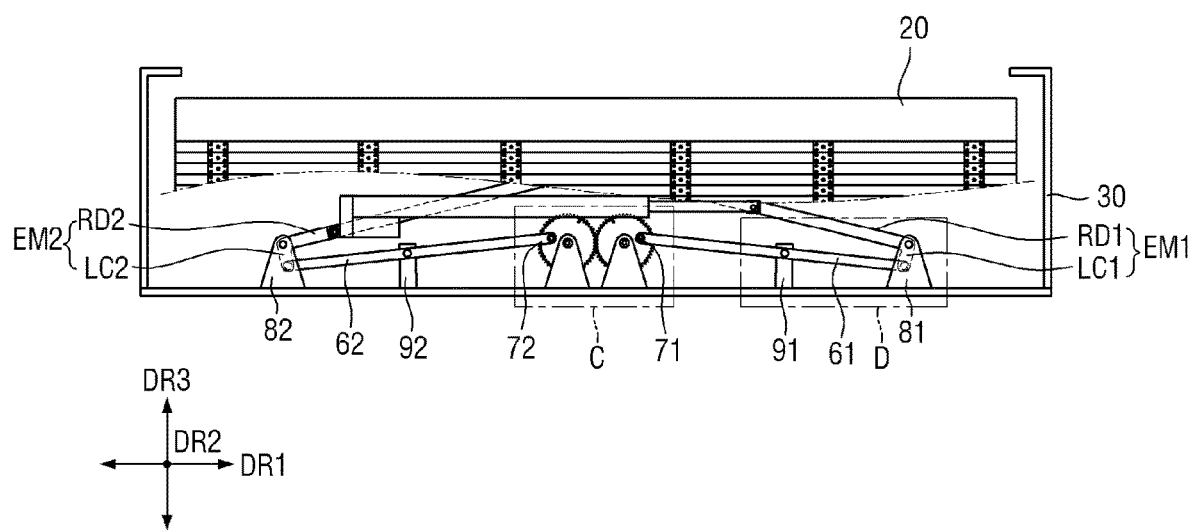
FIG. 5 is a front view of a display panel of which the display panel was drawn in according to an embodiment.
Figure 6:
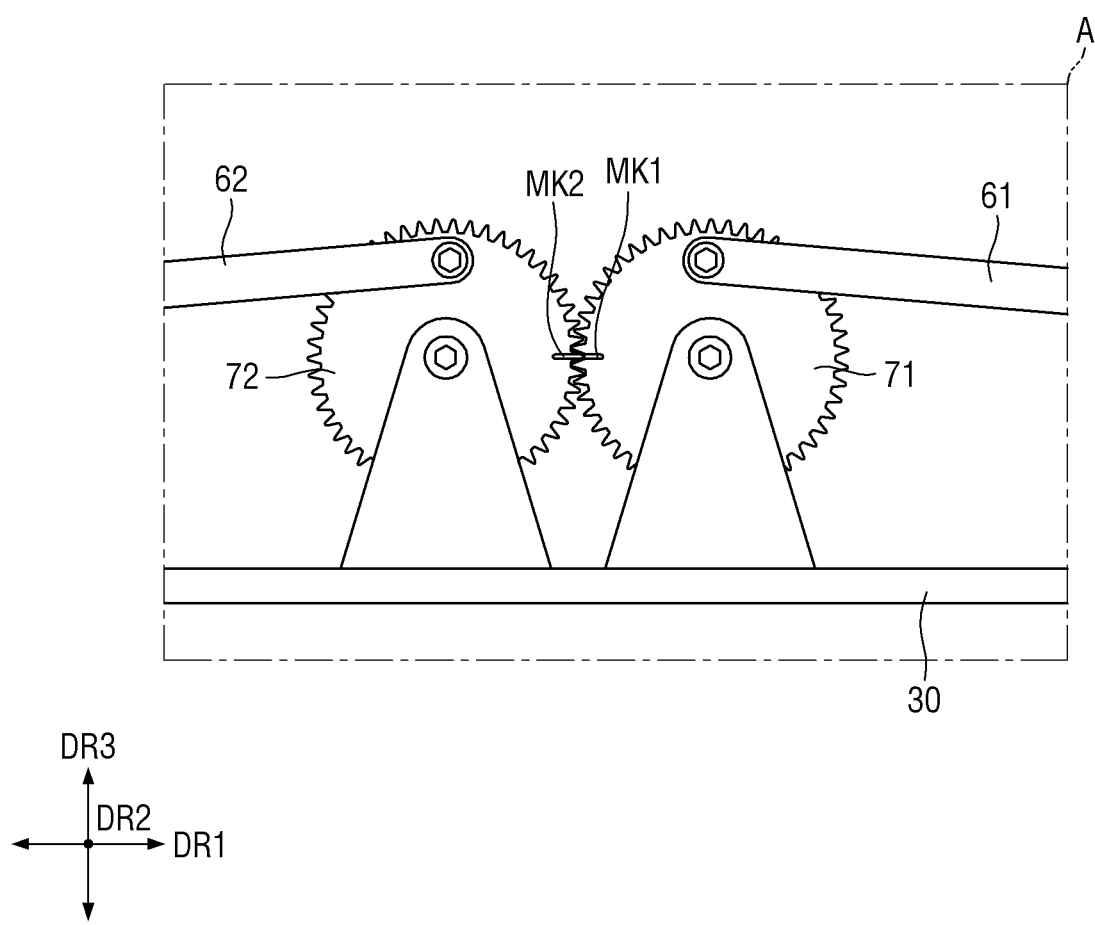
FIG. 6 is an enlarged view of portion 'A' of FIG. 4.
Figure 7:
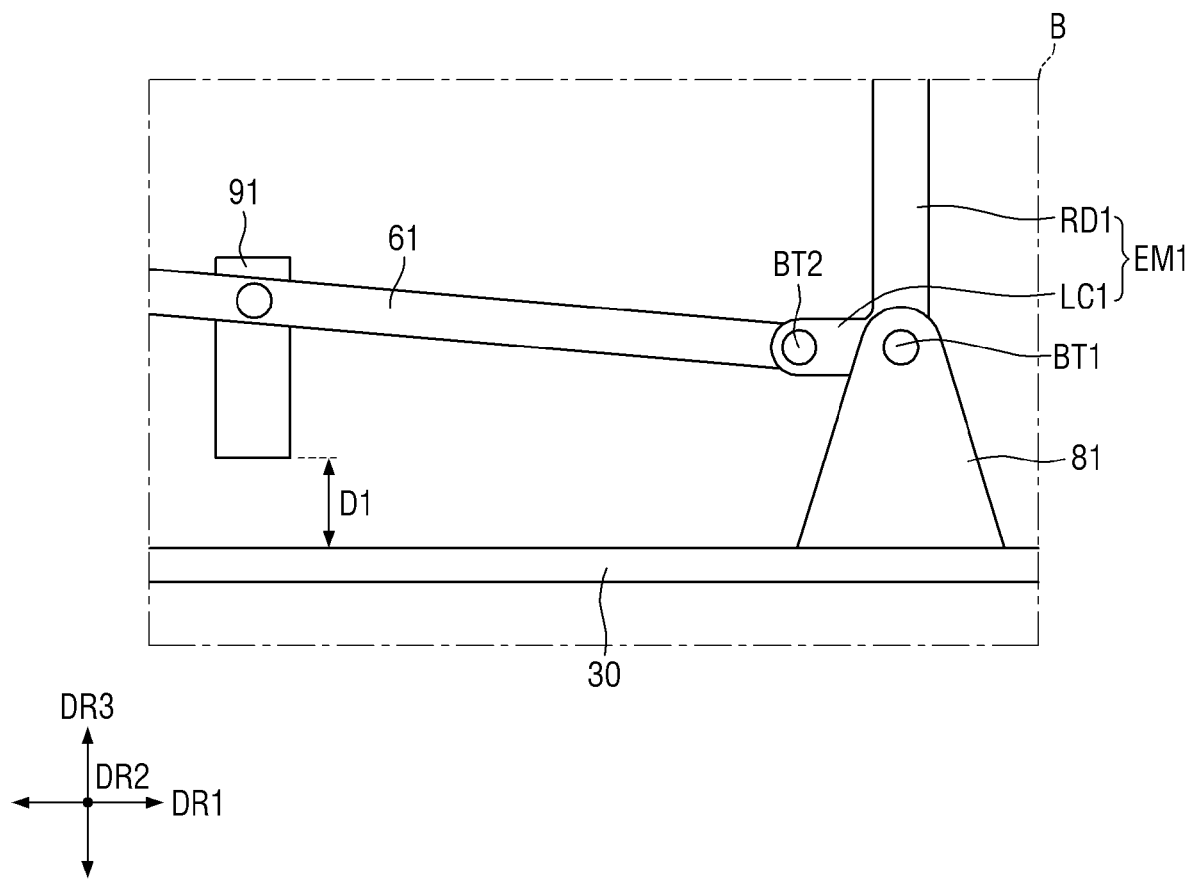
FIG. 7 is an enlarged view of portion 'B' of FIG. 4.
Figure 8:
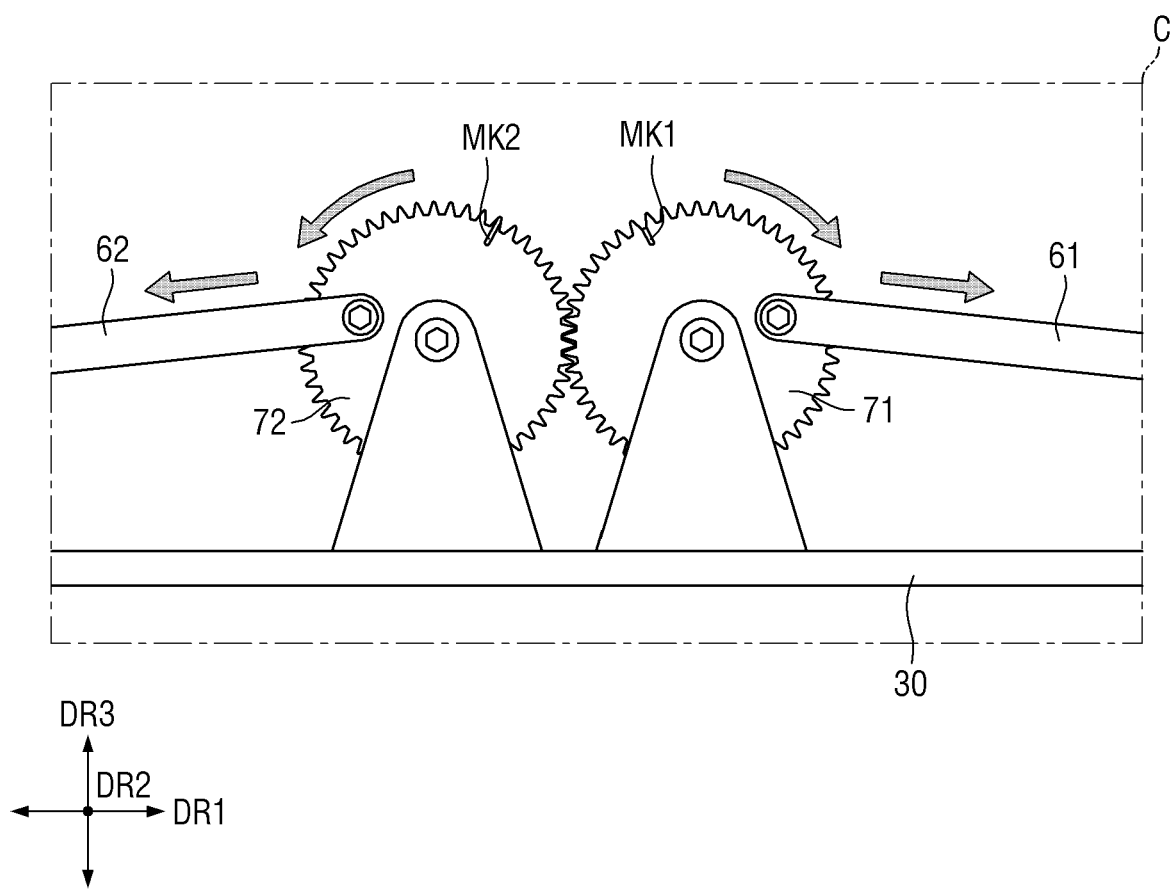
FIG. 8 is an enlarged view of portion 'C' of FIG. 5.
Figure 9:
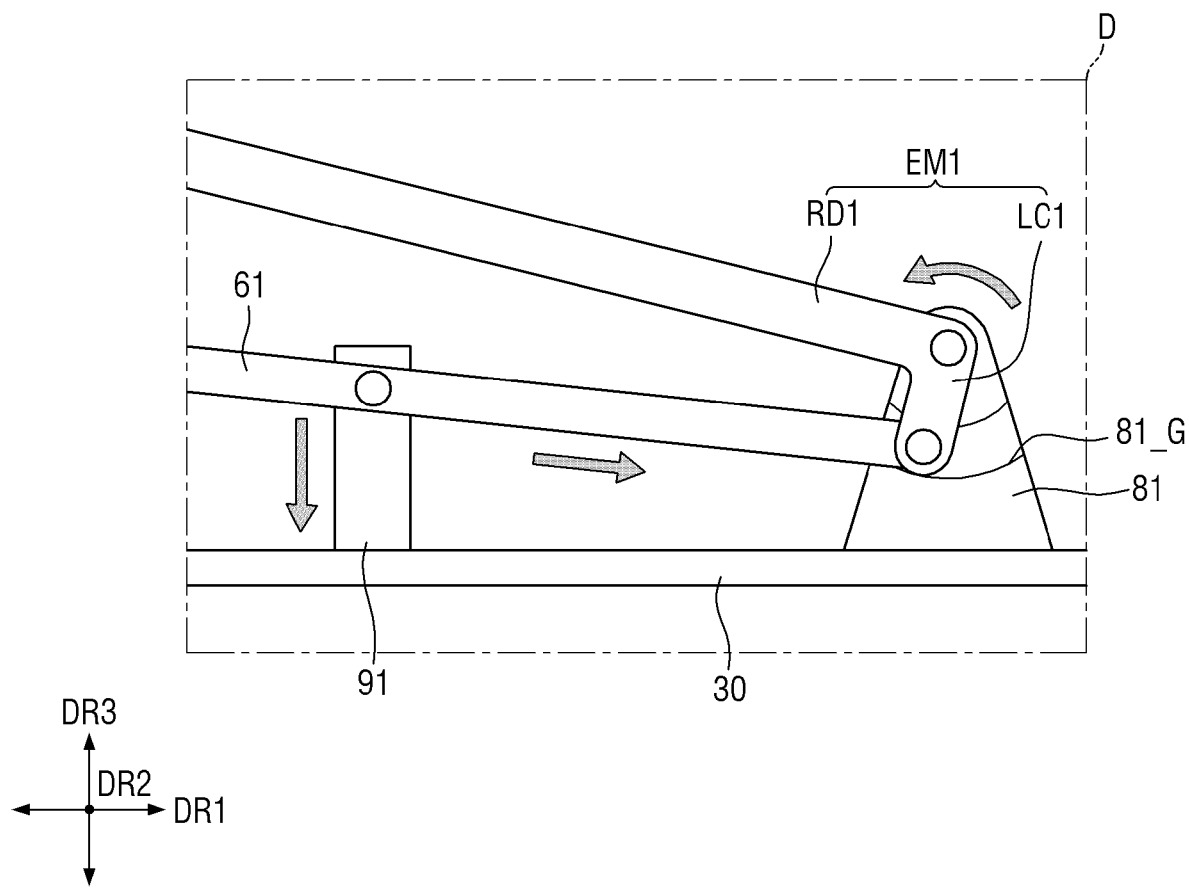
FIG. 9 is an enlarged view of portion 'D' of FIG. 5.

FIG. 4 is a front view of a display device of which the display panel was drawn out according to an embodiment. FIG. 5 is a front view of a display panel of which the display panel was drawn in according to an embodiment. FIG. 6 is an enlarged view of portion 'A' of FIG. 4. FIG. 7 is an enlarged view of portion 'B' of FIG. 4. FIG. 8 is an enlarged view of portion 'C' of FIG. 5. FIG. 9 is an enlarged view of portion 'D' of FIG. 5.

Although it may be expressed that the display panel 10 is lifted up or down to indicate the display panel 10 being completely lifted up or down, the disclosure is not limited thereto. If the display panel 10 is lifted up or down, this may mean that the display panel 10 is not completely lifted up or down or that the display panel 10 is being lifted up or down. Furthermore, if the display panel 10 is completely lifted up or down, this may mean that the first and second lift members 41 and 42 are completely unfolded or folded, but the disclosure is not limited thereto.

Referring to FIGS. 4 and 5, the display panel 10 may be lifted up or down in the third direction DR3 by the first and second lift members 41 and 42. In an embodiment, the display panel 10 may be drawn out from the inner space of the housing 30 in the case where the display panel 10 is lifted up through the opening on the top of the housing 30 and drawn into the inner space of the housing 30 in the case where the display panel 10 is lifted down.

When the display panel 10 is lifted up or down, the first and second lift members 41 and 42 may vary in length in the third direction DR3. In an embodiment, the lengths of the first and second lift members 41 and 42 in the third direction DR3 may be expanded in the case where the display panel 10 is lifted up, and may be shortened in the case where the display panel 10 is lifted down. The length in the third direction DR3 may be a height.

When the display panel 10 is lifted up or down, the first and second lift members 41 and 42 may be folded or unfolded to change the length in the third direction DR3. In an embodiment, in the case where the display panel 10 is lifted up, the first and second lift members 41 and 42 may be respectively folded about the first and second connection members CM1 and CM2 to form a shape of 'L' when the display panel 10 is completely lifted down and/or while the display panel 10 is being lifted up or down and they may be respectively unfolded to form a shape of 'I' when the display panel 10 is completely lifted up.

When the display panel 10 is lifted up or down, the first and third elevation members EM1 and EM3 may rotate about the first connection member CM1, and the second and fourth elevation members EM2 and EM4 may rotate about the second connection member CM2. When the display panel 10 is lifted down, the first and fourth elevation members EM1 and EM4 may rotate in a first rotation direction, and the second and third elevation members EM2 and EM3 may rotate in a second rotation direction different from the first rotation direction. When the display panel 10 is lifted up, the first and fourth elevation members EM1 and EM4 may rotate in the second rotation direction, and the second and third elevation members EM2 and EM3 may rotate in the first rotation direction. In an embodiment, the first rotation direction may be the counterclockwise direction, and the second rotation direction may be the clockwise direction.

The speed at which a side of the display panel 10 is lifted up or down and the speed at which another side of the display panel 10 is lifted up or down may be equal to or different from each other. The speed at which a side of the display panel 10 is lifted up or down and the speed at which another side of the display panel 10 is lifted up or down may respectively be a speed at which the length of the first lift member 41 varies in the third direction DR3 and a speed at which the length of the second lift member 42 varies in the third direction DR3. In an embodiment, the speed at which the side of the display panel 10 is lifted up or down and the speed at which the another side of the display panel 10 is lifted up or down may be equal to each other. The top side of the display panel 10 may remain horizontal when the display panel 10 is lifted up or down.

The speed at which a side of the display panel 10 is lifted up or down and the speed at which another side of the display panel 10 is lifted up or down may be adjusted by the first and second sync gears 71 and 72. The first and second sync gears 71 and 72 may enable the speed at which the first lift member 41 moves up or down and the speed at which the second lift member 42 moves up or down to be interlocked such that a ratio of the speed at which the second lift member 42 moves up or down to the speed at which the first lift member 41 moves up or down (or a ratio of the speed at which the first lift member 41 moves up or down to the speed at which the second lift member 42 moves up or down) is adjusted to a certain value.

In the following description, the height may be a distance from a support surface supporting the first and second lift members 41 and 42, e.g., bottom surface of the inner space of the housing 30 in the third direction DR3, without being limited thereto.

Referring to FIGS. 4, 6, and 7, in the case where the display panel 10 is lifted up, the drive member 50 may be maximally expanded. The drive member 50 may be positioned at the maximum height.

In case that the display panel 10 is lifted up, the angle between the first and third elevation members EM1 and EM3 and the angle between the second and fourth elevation members EM2 and EM4 may each be about 180 degrees. In case that the display panel 10 is lifted up, the first and second lift members 41 and 42 may have a straight linear shape extending in the third direction DR3.

In case that the first and second lift members 41 and 42 are unfolded, the first and second link members 61 and 62 may be positioned at the maximum height. In case that the first lift member 41 is completely unfolded, a side of the first link member 61 may be connected to the end of the first link connection member LC1 of the first elevation member EM1 having the maximum height. The end of the first link connection member LC1 may be a portion to which a second coupling member BT2 to be described later is coupled. A first coupling member BT1 may be, for example, a bolt. The another side of the first link member 61 may be connected to the upper portion of the first sync gear 71.

The upper portion of the first sync gear 71 may be one point of the first sync gear 71 that is positioned at the maximum height when the first lift member 41 is completely unfolded. In case that the second lift member 42 is completely unfolded, a side of the second link member 62 may be connected to the end of the second link connection member LC2 of the first elevation member EM1 having the maximum height, and another side of the second link member 62 may be connected to the upper portion of the second sync gear 72. Although not shown in the drawing, the end of the second link connection member LC2, similarly to the end of the first link connection member LC1, may be a portion to which a third coupling member (not shown) is coupled, the third coupling member rotatably coupling the second link connection member LC2 to the second link member 62.

The upper portion of the second sync gear 72 may be one point of the second sync gear 72 that is positioned at the maximum height when the second lift member 42 is completely unfolded. In case that the display panel 10 is completely lifted up, a point where the first link member 61 and the first link connection member LC1 are connected, a point where the second link member 62 and the second link connection member LC2 are connected, a point where the first link member 61 and the first sync gear 71 are connected, and a point where the second link member 62 and the second sync gear 72 are connected may each be at a maximum height. In an embodiment, the point where the first link member 61 and the first link connection member LC1 are connected and the point where the second link member 62 and the second link connection member LC2 are connected may be lower in height than the point where the first link member 61 and the first sync gear 71 are connected and the point where the second link member 62 and the second sync gear 72 are connected, respectively.

In case that the display panel 10 is lifted up, the first and second stoppers 91 and 92 may each be spaced apart from the bottom surface defining the inner space of the housing 30 by a first distance D1. The first distance D1 may be a distance in the third direction DR3.

Referring to FIGS. 5, 8, and 9, the drive member 50 may be shortened in length in the first direction DR1 while the display panel 10 is being lifted down. The first rod member RD1 of the first elevation member EM1, which is connected to the side of the linear motor, may rotate in the first rotation direction, and the second rod member RD2 of the second elevation member EM2, which is connected to the another side of the linear motor, may rotate in the second rotation direction. Accordingly, the first link connection member LC1 connected to the first rod member RD1 and the second link connection member LC2 connected to the second rod member RD2 may rotate in the first and second rotation directions, respectively. In an embodiment, the first rotation direction may be the counterclockwise direction, and the second rotation direction may be the clockwise direction. The drive member 50 may be lowered in height while the display panel 10 is being lifted down.

The drive member 50 may be shortened while the display panel 10 is being lifted down. In an embodiment, in case that the display panel 10 is maximally lifted down or the first and second lift members 41 and 42 are completely folded, the drive member 50 may be maximally shortened. The drive member 50 may be positioned at the minimum height. In case that the first and second lift members 41 and 42 are completely folded, the first and second lift members 41 and 42 may be in the state of not being further folded by the first and second stoppers 91 and 92.

When the display panel 10 is lifted down, the angle between the first and third elevation members EM1 and EM3 and the angle between the second and fourth elevation members EM2 and EM4 may each be in a range of about 0 degrees and to about 180 degrees. In an embodiment, in case that the display panel 10 is completely lifted down, the angle between the first and third elevation members EM1 and EM3 and the angle between the second and fourth elevation members EM2 and EM4 may each be in a range of about 0 degrees to about 45 degrees.

When the display panel 10 is lifted down, the first link connection member LC1 may rotate in the first rotation direction about a portion where the first elevation member EM1 and the first support member 81 are connected. The portion where the first elevation member EM1 and the first support member 81 are connected may be a portion to which the first coupling member BT1 coupling the first elevation member EM1 to the first support member 81 is coupled. The first rotation direction may be a direction away from the first sync gear 71. The first link member 61 may be pulled in a direction away from the first sync gear 71 by the first link connection member LC1. Likewise, the second link member 62 may be pulled in a direction away from the second sync gear 72 by the second link connection member LC2.

The display device 1 may further include a second coupling member BT2 that rotatably couples the first link connection member LC1 to the first link member 61. In an embodiment, the second coupling member BT2 may be a bolt. The second coupling member BT2 may be integrally coupled to the first link connection member LC1 to rotate, while the display panel 10 is being lifted down, about a portion where the first elevation member EM1 and the first support member 81 are connected, e.g., a portion to which the first coupling member BT1 is coupled. In an embodiment, the first support member 81 may further include a first guide groove 81_G formed corresponding to the rotation path of the second coupling member BT2, and the second coupling member BT2 may be guided by the first guide groove 81_G defining the rotation path when the display panel 10 is lifted up or down. Although not shown in the drawing, the display device 1 may further include a fourth coupling member rotatably coupling the second link connection member LC2 to the second link member 62, and the fourth coupling member may be guided by a second guide groove formed on the second support member 82 to define the rotation path of the fourth coupling member.

When the display panel 10 is lifted down, the first sync gear 71 may be rotated by the first link member 61. The first sync gear 71 may rotate in a direction different from or identical to the rotation direction of the first link connection member LC1. In an embodiment, the first link connection member LC1 may rotate in the first rotation direction, and the first sync gear 71 may rotate in the second rotation direction. Likewise, the second sync gear 72 may rotate in a direction opposite to the rotation direction of the first sync gear 71 by the second link member 62. The first and second sync gears 71 and 72 are engaged such that the rotation ratio of the first and second sync gears 71 and 72 may be adjusted to a predetermined value.

When the display panel 10 is lifted down, the first and second link members 61 and 62 may be lowered in height. For example, as shown in FIGS. 8 and 9, the first link connection member LC1 and the first sync gear 71 may each rotate, when the display panel 10 is lifted down, in a direction such that the portion where the first sync gear 71 and the first link member 61 are connected and the portion where the first link connection member LC1 and the first link member 61 are connected are lowered in height, and accordingly, the first link member 61 may be lowered in height. Likewise, the portion where the second sync gear 72 and the second link member 62 are connected and the portion where the second link connection member LC2 and the second link member 62 are connected may be lowered in height, and accordingly, the second link member 62 may be lowered in height.

When the display panel 10 is lifted down, the first and second stoppers 91 and 92 may be lowered in height. When the display panel 10 is maximally lifted down, the lower end of the first stopper 91 may contact the housing 30 to limit a maximum descending distance or a minimum height of the side of the display panel 10. Likewise, when the display panel 10 is maximally lifted down, the lower end of the second stopper 92 may contact the housing 30 to limit a maximum descending distance or a minimum height of the another side of the display panel 10.

Referring to FIGS. 6 and 8, the first and second sync gears 71 and 72 may include a first position mark MK1 and a second position mark MK2, respectively.

The first and second position marks MK1 and MK2 may indicate whether the first and second sync gears 71 and 72 rotate, respectively. The first and second position marks MK1 and MK2 may indicate rotation angles of the first and second sync gears 71 and 72, respectively. In an embodiment, the first and second position marks MK1 and MK2 may be disposed on one side surface and/or the other side surface arranged with the gear teeth therebetween. The first and second position marks MK1 and MK2 may be disposed at a region adjacent to the edges of the first and second sync gears 71 and 72, respectively.

When the display panel 10 is lifted up, the distance between the first and second position marks MK1 and MK2 may decrease. When the display panel 10 is maximally lifted up, the distance between the first and second position marks MK1 and MK2 may be minimized. In some embodiments, the first and second position marks MK1 and MK2 may contact each other. The first and second position marks MK1 and MK2 may form one straight line.

When the display panel 10 is lifted down, the distance between the first and second position marks MK1 and MK2 may increase. In case that the display panel 10 is completely lifted down, the distance between the first and second position marks MK1 and MK2 may be maximized.

Figure 10A:
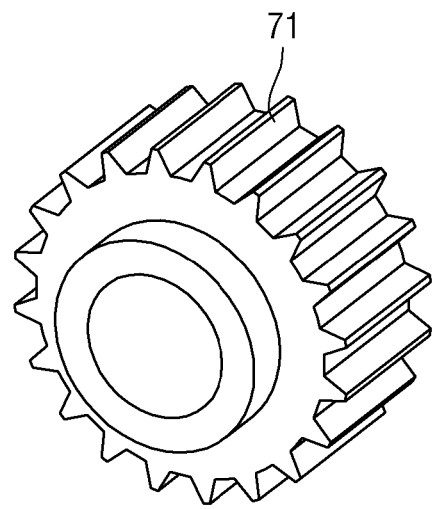
FIG. 10A illustrates a first sync gear according to an embodiment.
Figure 10B:
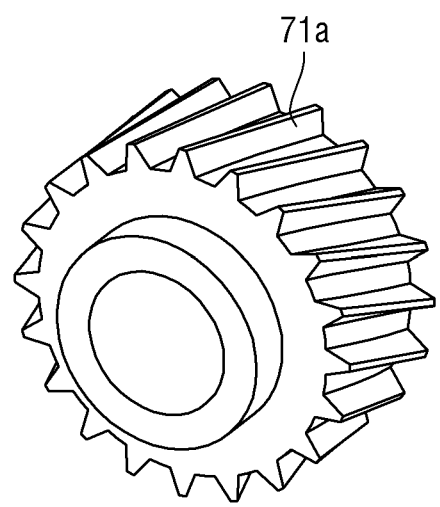
FIG. 10B illustrates a first sync gear according to another embodiment.

FIG. 10A illustrates a first sync gear according to an embodiment, and FIG. 10B illustrates a first sync gear according to another embodiment.

FIG. 10A is a perspective view of the first sync gear 71 according to an embodiment. FIG. 10B is a perspective view of the first sync gear 71a according to another embodiment.

In an embodiment, the second sync gear 72 is substantially identical with or similar to the first sync gear 71 and thus the following description is mainly directed to the first sync gear 71.

Referring to FIG. 10A, the first sync gear 71 may have a radius. The radius of the first sync gear 71 may be equal to or greater than a protruding length of the first link connection member LC1.

The first sync gear 71 may include gear teeth disposed along the circumferential direction to surround the outer circumferential surface to protrude from the outer circumferential surface. The lifting speed of the first lift member 41 may be determined by the number of the gear teeth of the first sync gear 71. The ends of the gear teeth may extend parallel to the thickness direction and/or the rotation axis of the first sync gear 71. For example, the first sync gear 71 may be a spur gear.

Referring to FIG. 10B, the ends of the gear teeth of the first sync gear 71a may be formed to be inclined to the thickness direction and/or the rotation axis of the first sync gear 71a. For example, the first sync gear 71a may be a helical gear. For example, the second sync gear may be a helical gear. This may make it possible to reduce backlash between the first and second sync gears 71a and 72a.

Figure 11A:
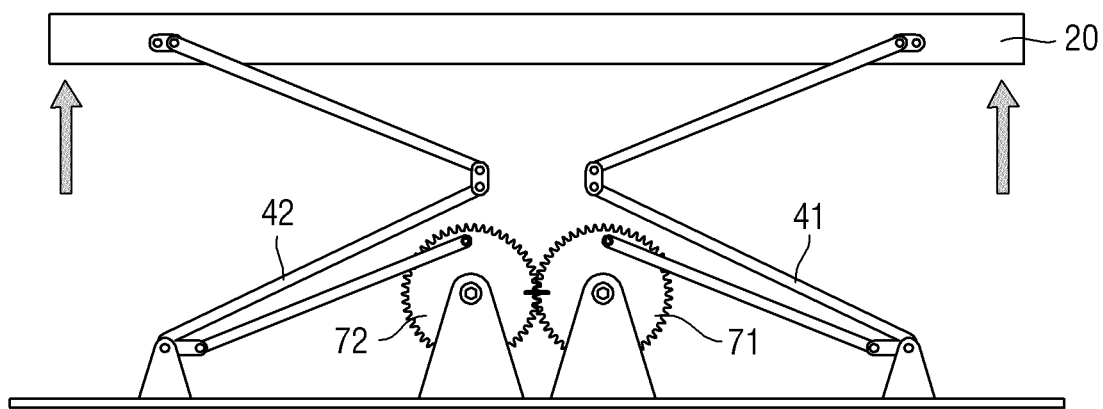
FIG. 11A is a view illustrating a lifting speed of a display panel in accordance with a gear ratio between a first sync gear and a second sync gear.
Figure 11B:
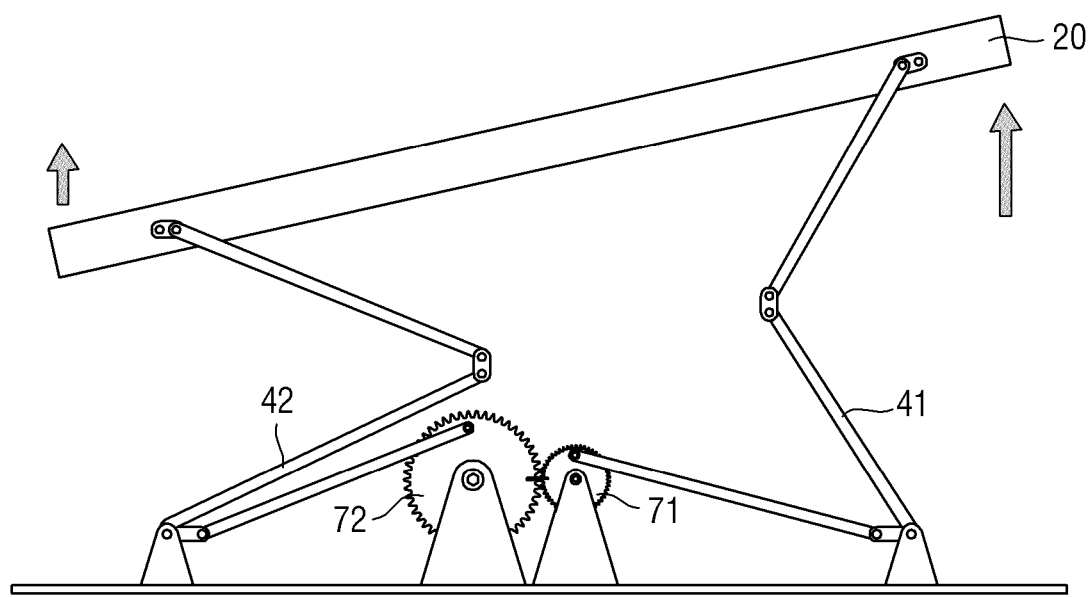
FIG. 11B is a view illustrating a lifting speed of a display panel in accordance with an adjusted gear ratio between a first sync gear and a second sync gear.

FIG. 11A is a view illustrating a lifting speed of a display panel in accordance with a gear ratio between a first sync gear and a second sync gear, and FIG. 11B is a view illustrating a lifting speed of a display panel in accordance with an adjusted gear ratio between a first sync gear and a second sync gear.

FIG. 11A is a diagram illustrating a case where the gear ratio of the first and second sync gears 71 and 72 is 1:1. FIG. 11B is a diagram illustrating a case where the gear ratio of the first and second sync gears 71 and 72 is not 1:1.

Referring to FIGS. 11A and 11B, the lifting speed of the side of the display panel 10 and the lifting speed of the another side of the display panel 10 may be adjusted by the gear ratio of the first and second sync gears 71 and 72 as described above.

Referring to FIG. 11A, in case that the gear ratio between the first and second sync gears 71 and 72 is 1:1, the lifting speeds of the side and the another side of the display panel 10 may be equally adjusted. In case that the display panel 10 is lifter up or down, a lifting speed of the side of the display panel 10 may be equal to a lifting speed of the another side of the display panel 10. The top side of the display panel 10 may remain horizontal while the display panel 10 is being lifted up or down. However, the gear ratio of the first and second sync gears 71 and 72 may vary according to the lengths and/or positions of the parts constituting the first and second lift members 41 and 42.

Referring to FIG. 11B, in case that the gear ratio between the first and second sync gears 71 and 72 is not 1:1, the lifting speeds of the side and the another side of the display panel 10 may be differently adjusted. In an embodiment, a number of teeth of the first sync gear 71 may be different from a number of teeth of the second sync gear 72. The side of the display panel 10 may be lifted up or down faster or slower than the another side of the display panel 10. If necessary, the lifting speeds of the side and the another side of the display panel 10 may be differently adjusted by changing the gear ratio of the first and second sync gears 71 and 72.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
   a display panel;
   a first lift member connected to a side of the display panel and including a first elevation member rotating in a first rotation direction;
   a second lift member connected to another side of the display panel and including a second elevation member rotating in a second rotation direction different from the first rotation direction;
   a drive member connected to the first lift member and the second lift member, the drive member rotating the first elevation member and the second elevation member;
   a first link member having a side connected to the first elevation member;
   a second link member having a side connected to the second elevation member;
   a first sync gear connected to another side of the first link member, the first sync gear rotating in association with rotation of the first elevation member; and
   a second sync gear engaged with the first sync gear and connected to another side of the second link member, the second sync gear rotating in association with rotation of the second elevation member.

2. The display device of claim 1, wherein the drive member includes a linear motor that expands or contracts in a width direction of the display panel.

3. The display device of claim 2, wherein
   a side of the drive member is rotatably connected to the first elevation member, and
   another side of the drive member is rotatably connected to the second elevation member.

4. The display device of claim 3, wherein
   the side of the drive member is connected to a middle portion of the first elevation member, and
   the another side of the drive member is connected to a middle portion of the second elevation member.

5. The display device of claim 3, wherein
   the drive member expands to increase a distance between the first elevation member and the second elevation member when the display panel is lifted up, and
   the drive member shortens to decrease a distance between the first elevation member and the second elevation member when the display panel is lifted down.

6. The display device of claim 3, wherein
   the drive member moves up as the display panel is lifted up, and
   the drive member moves down as the display panel is lifted down.

7. The display device of claim 1, further comprising:
   a third elevation member connected to an upper portion of the display panel;
   a fourth elevation member spaced apart from the third elevation member and connected to another upper portion of the display panel;
   a first connection member connecting a side of the first elevation member to a side of the third elevation member; and
   a second connection member connecting a side of the second elevation member to a side of the fourth elevation member.

8. The display device of claim 7, further comprising
   a panel support member covering at least a part of a surface of the display panel and including a plurality of segments, wherein another side of the third elevation member and another side of the fourth elevation member are rotatably coupled to the panel support member.

9. The display device of claim 1, wherein
the first lift member varies in height by rotation of the first elevation member,
the second lift member varies in height by rotation of the second elevation member, and
a ratio of a height change of the second lift member to a height change of the first lift member is determined by a gear ratio of the first sync gear and the second sync gear.

10. The display device of claim 9, wherein
the gear ratio of the first sync gear and the second sync gear is 1:1, and
in case that the display panel is lifted up or down, a lifting speed of the side of the display panel is equal to a lifting speed of the another side of the display panel.

11. The display device of claim 9, wherein
a number of teeth of the first sync gear is different from a number of teeth of the second sync gear, and
a lifting speed of the side of the display panel is different from a lifting speed of the another side of the display panel.

12. The display device of claim 1, wherein
the first elevation member includes a first rod member and a first link connection member protruding toward the first sync gear, and
the second elevation member includes a second rod member and a second link connection member protruding toward the second sync gear.

13. The display device of claim 12, wherein
a protruding length of the first link connection member is equal to or less than a radius of the first sync gear, and
a protruding length of the second link connection member is equal to or less than a radius of the second sync gear.

14. The display device of claim 12, further comprising:
a first support member that supports the first elevation member;
a second support member that supports the second elevation member;
a first coupling member that rotatably couples the first link connection member to the first link member; and
a second coupling member that rotatably couples the second link connection member to the second link member.

15. The display device of claim 14, wherein
the first support member includes a first guide groove that guides a movement path of the first coupling member, and
the second support member includes a second guide groove that guides a movement path of the second coupling member.

16. The display device of claim 1, wherein
the first link member and the second link member move up as the display panel is lifted up, and
the first link member and the second link member move down as the display panel is lifted down.

17. The display device of claim 16, further comprising:
a first stopper protruding in a direction crossing a length direction of the first link member and limiting a maximum descending distance of the first link member; and
a second stopper protruding in a direction crossing a length direction of the second link member and limiting a maximum descending distance of the second link member.

18. The display device of claim 17, further comprising:
a first stop surface disposed below the first stopper; and
a second stop surface disposed below the second stopper,
wherein in case that the display panel is maximally lifted down, the first stopper contacts the first stop surface and the second stopper contacts the second stop surface.

19. The display device of claim 1, wherein the first sync gear and the second sync gear each include a position mark that identifies whether the display panel is maximally lifted up.

20. The display device of claim 1, wherein the first sync gear and the second sync gear are each a helical gear.

21. The display device of claim 1, wherein
the another side of the first link member rises with respect to the a side of the first link member as the display panel is lifted up, and
the another side of the second link member rises with respect to the a side of the second link member as the display panel is lifted up.

22. The display device of claim 1, wherein the first lift member is arranged on a first side of the display panel, the second lift member is arranged on a second and opposite side of the display panel, the second lift member being spaced-apart from the first lift member.

* * * * *